US006556720B1

United States Patent
Avinash

(10) Patent No.: US 6,556,720 B1
(45) Date of Patent: Apr. 29, 2003

(54) METHOD AND APPARATUS FOR ENHANCING AND CORRECTING DIGITAL IMAGES

(75) Inventor: Gopal B. Avinash, New Berlin, WI (US)

(73) Assignee: GE Medical Systems Global Technology Company LLC, Wauskeha, WI (US)

(*) Notice: Subject to any disclaimer, the term of this patent is extended or adjusted under 35 U.S.C. 154(b) by 0 days.

(21) Appl. No.: 09/317,416

(22) Filed: May 24, 1999

(51) Int. Cl.⁷ .................................................. G06K 9/40
(52) U.S. Cl. ....................... 382/260; 382/263; 382/275; 382/128
(58) Field of Search ................................ 382/128, 131, 382/132, 260, 263, 264, 274, 275, 282, 283

(56) References Cited

U.S. PATENT DOCUMENTS 5,835,618 A * 11/1998 Fang et al. ................. 382/132
5,933,540 A * 8/1999 Lakshaminarayanan et al. . 382/260

OTHER PUBLICATIONS

US 5 0 12 524 A (Le Beau, Christopher J.).
Lin Hong et al: "Fingerprint Enhancement" Proceeding. Third IEEE workshop on Applications of Computer Vision. WACV '96 (CAT No. 96TB100084), Sarasota, FL, USA 2–4, Dec. 1996; pp. 202–207, XP002146608, IEE Comput. Soc. Press.

Kundu, A., "Enhancement of JPEG Coded Images by Adaptive Spatial Filtering" Proceedings of the International Conference on Image Processing (ICIP)., US, Los Alamitos, IEEE Coput. Soc. Press, Oct. 23, 1995, pp. 187–190, XP000624206.

Gerig, G. et al: "Nonlinear Anisotropic Filtering of MRI Data," IEEE Transactions on Medical Imaging, US, IEEE Inc., New York, vol. 11, No. 2, Jun. 1, 1992, pp. 221–232, XP000288458.

Régis Guillemaud and Michael Brady, "Estimating the Bias Field of MR Images", IEEE Transactions on Medical Imaging, vol. 16, No. 3, Jun. 1997.

* cited by examiner

Primary Examiner—Thomas D. Lee
(74) Attorney, Agent, or Firm—Quarles & Brady LLP; Carl Horton

(57) ABSTRACT

A digital image processing method includes the steps of acquiring (60) pixel data which defines a digital image (36), identifying (66) structural regions (48) within the digital image, resulting in a structure mask showing the structural regions and non-structural regions (50), enhancement filtering (68–76) the digital image using the structure mask, and correcting (78) for intensity non-uniformities in the digital image, resulting in an enhanced, corrected digital image. An apparatus for carrying out the method includes a signal processing circuit configured to receive signals representing the internal features and to perform the steps (60–78) of the method.

9 Claims, 7 Drawing Sheets

METHOD AND APPARATUS FOR ENHANCING AND CORRECTING DIGITAL IMAGES

BACKGROUND OF THE INVENTION

The field of the invention is the enhancement of digital images acquired using various imaging modalities. More particularly, the invention relates to producing higher-quality digital images using a combination of noise-reduction and non-uniformity correction techniques.

Various techniques have been developed for acquiring and processing discrete pixel image data. Discrete pixel images are composed of an array or matrix of pixels having varying properties, such as intensity, color, and so on. The data defining each pixel may be acquired in various manners, depending upon the imaging modality employed. Modalities in medical imaging, for example, include magnetic resonance imaging (MRI) techniques, X-ray techniques, and so forth. In general, each pixel is represented by a signal, typically a digitized value representative of a sensed parameter, such as an emission from material excited within each pixel region or radiation received within each pixel region.

To facilitate interpretation of the image, the pixel values must be filtered and processed to enhance definition of features of interest to an observer. Ultimately, the processed image is reconstituted for displaying or printing. In many medical applications, an attending physician or radiologist will consult the image for identification of internal features within a subject, where those features are defined by edges, textural regions, contrasted regions, and so forth.

Unless further processing is applied to a digital image, the image is likely to have a poor signal to noise ratio (SNR), resulting in blurred or ambiguous feature edges and non-uniformities in spacial intensity. With respect to ambiguous feature definition, where variations in image signal acquisition, processing, and display circuitry between systems and between images in a single system result in corresponding variations in relationships between the pixels defining an image, structures of interest within a subject may not be consistently sensed, processed and displayed. Consequently, structures, textures, contrasts, and other image features may be difficult to visualize and compare both within single images and between a set of images. As a result, attending physicians or radiologists presented with the images may experience difficulties in interpreting the relevant structures.

With respect to non-uniformity correction, in many areas of imaging including MRI and computed tomography, acquired images are corrupted by slowly varying multiplicative inhomogeneities or non-uniformities in spatial intensity. Such non-uniformities can hinder visualization of the entire image at a given time, and can also hinder automated image analysis. Such inhomogeneity is a particular concern in MRI, when single or multiple surface coils are used to acquire imaging data. The acquired images generally contain intensity variations resulting from the inhomogeneous sensitivity profiles of the surface coil or coils. In general, tissue next to the surface coil appears much brighter than tissue far from the coil. Therefore, in order to optimally display and film the entire image, the signal variation due to the inhomogeneous sensitivity profile of the surface coil needs to be corrected.

Several prior art methods either enhance features or correct for non-uniformities, but not both. For example, existing techniques for enhancing features may require operator intervention in defining salient structures, sometimes requiring processing of raw data several times based on operator adjustments before arriving at an acceptable final image. This iterative process is inefficient and requires a substantial amount of human intervention. Other prior art methods have been developed for enhancing features of the image while suppressing noise. For example, in one known method, pixel data is filtered through progressive low pass filtering steps. The original image data is thus decomposed into a sequence of images having known frequency bands. Gain values are applied to the resulting decomposed images for enhancement of image features, such as edges. Additional filtering, contrast equalization, and gradation steps may be employed for further enhancement of the image.

While such techniques provide useful mechanisms for certain types of image enhancement, they are not without drawbacks. For example, gains applied to decomposed images can result in inadvertent enhancement of noise present in the discrete pixel data. Such noise, when enhanced, renders the reconstructed image difficult to interpret, and may produce visual artifacts which reduce the utility of the reconstructed image, such as by rendering features of interest difficult to discern or to distinguish from non-relevant information.

Prior art methods have also been employed for correcting non-uniformities, although not simultaneously with the above-described methods for feature enhancement. Prior art methods for correcting for non-uniformities include various intensity correction algorithms which correct surface coil images by dividing out an estimate of the surface coil's sensitivity profile. One such method is based on the assumption that distortion arising from use of surface coils generally varies slowly over space. In accordance with that prior art method, a low pass filtering operation is applied to the measured or acquired image signal. For this prior art method to be effective, however, the image signal must not contain sharp intensity transitions. Unfortunately, at least in MRI imaging, an air-lipid interface usually contains sharp intensity transitions which violate the basic assumption that the low frequency content in the scene being imaged is solely due to the inhomogeneity distortion from the surface coil's sensitivity profile.

Accordingly, certain prior art hybrid filtering techniques have been developed. Although these techniques have been effective in accounting for external transitions, they have not been particularly effective in accounting for significant internal transitions (e.g., transitions that occur between the edges of an organ or other tissue structure).

As stated before, acquired images are corrupted by slowly varying multiplicative non-uniformities. When such images are corrected using prior-art techniques, substantial noise amplification can occur, which hinders the visualization of salient features. Therefore, it is common to use less correction than optimal to prevent noise amplification. Besides using less correction, the image may be pre-filtered to reduce noise. Such pre-filtering, however, can also remove salient features from the image. Thus, the combination of pre-filtering and non-uniformity correction techniques has not been put into practice because the combination of prior-art methods has resulted in less-than-optimal images.

In image processing literature, several techniques are described to separately improve the SNR and non-uniformity in images. Many authors have described enhancing SNR in MRI images by spatial domain filtering. Likewise, several articles describe improving the shading by correcting for the non-uniformity in the images. Usually these two operations are treated as though they are disjointed operations.

R. Guillemaud and M. Brady have discussed simultaneous correction for noise and non-uniformity in IEEE Transactions in Medical Imaging, Vol. 16, pp.238–251 (1997). These authors used the anisotropic diffusion-based technique proposed by G. Gerig et al., IEEE Transactions in Medical Imaging, Vol. 11, pp.222–232 (1992), for noise reduction for both pre- and post-filtering with non-uniformity correction. They concluded that pre-filtering loses essential details in the non-uniformity corrected images. Therefore, Guillemaud and Brady chose to perform post-filtering of non-uniformity corrected images. This decision indicates that prior art methods obtain visibility of important weak structures at the expense of non-linear noise amplification.

What is needed is a method and apparatus which improves the visual quality of digital images. Particularly needed is a method and apparatus which reduce noise while correcting for non-uniformities in the image, resulting in better-quality images than were possible using prior art techniques.

BRIEF SUMMARY OF THE INVENTION

The present invention includes a method and apparatus for enhancing and correcting a digital image. After pixel data is acquired, which defines a digital image of internal features of a physical subject, structural regions within the digital image are identified, resulting in a structure mask showing the structural regions and non-structural regions. The digital image is enhancement filtered using the structure mask, and intensity non-uniformities in the filtered image are then corrected.

DESCRIPTION OF THE PREFERRED EMBODIMENT

The method and apparatus of the present invention provides the ability to produce higher-quality digital images in which noise has been reduced and non-uniformities have been corrected. This is accomplished by using a robust scheme which does not remove noise, but rather treats that noise as textural information. Essentially, the image is segmented before performing appropriate actions. Smoothing is done along the structures while sharpening is done across them. In the non-structure regions containing weak structures and noise, a homogenizing smoothing is performed, and a part of the texture is added back to retain the original spatial characteristics in a mitigated form.

The method and apparatus of the present invention substantially reduces unnatural noise amplification by mitigating noise before it is amplified. Intensity non-uniformities in the image are corrected using a preferred technique. The result of the pre-filtering and correction method is a visually pleasing uniform image which is easy to visualize and film.

Figure 1:
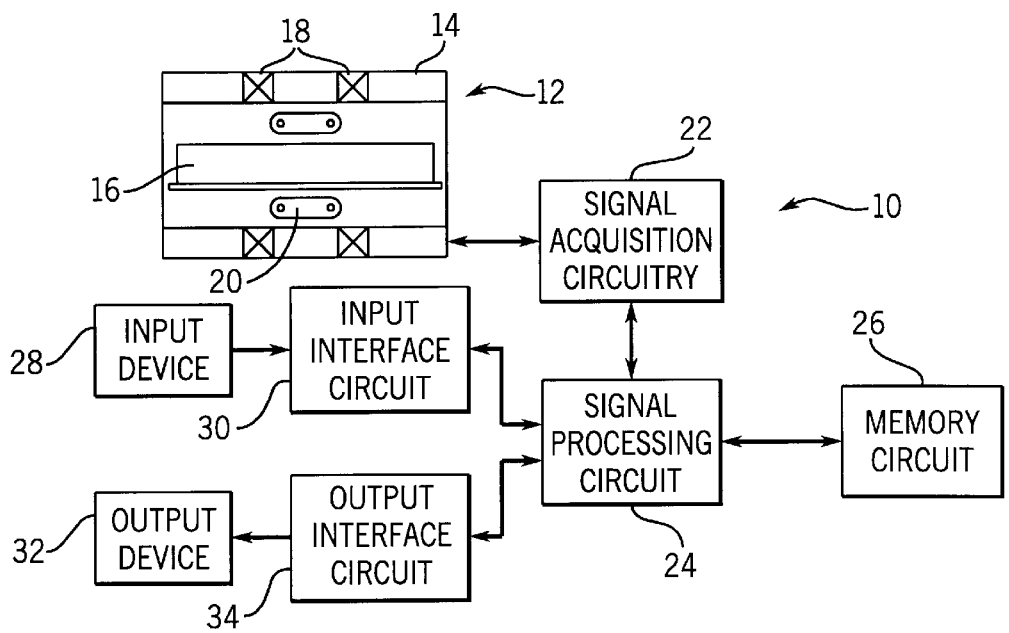
FIG. 1 illustrates a simplified block diagram of a magnetic resonance imaging system which incorporates the present invention.

Referring to FIG. 1, there is shown a simplified block diagram of an MRI system which incorporates the present invention. MRI system 10 is illustrated as including a scanner 12 coupled to circuitry for acquiring and processing discrete pixel data. Scanner 12 includes a support structure 14 in which a physical subject 16 (e.g., a human being) may be placed for acquiring images representative of internal features, such as tissues, fluids and so forth. Scanner 12 includes an electromagnet arrangement 18 for producing an electromagnetic field in a manner generally known in the art. Excitation and sensing coils 20 are provided within scanner 12 for exciting gyromagnetic materials within subject 16 and for sensing emissions from the materials.

Signals sensed by coils 20 are encoded to provide digital values representative of the excitation signals emitted at specific locations within the subject, and are transmitted to signal acquisition circuitry 22. Signal acquisition circuitry 22 also provides control signals for configuration and coordination of fields emitted by coils 20 during specific image acquisition sequences. Signal acquisition circuitry 22 transmits the encoded image signals to a signal processing circuit 24. Signal processing circuit 24 executes pre-established control logic routines stored within a memory circuit 26 to filter and condition the signals received from signal acquisition circuitry 22 to provide digital values representative of each pixel in the acquired image. These values are then stored in memory circuit 26 for subsequent processing and display.

Signal processing circuit 24 receives configuration and control commands from an input device 28 via an input interface circuit 30. Input device 28 will typically include an operator's station and keyboard for selectively inputting configuration parameters and for commanding specific image acquisition sequences. Signal processing circuit 24 is also coupled to an output device 32 via an output interface circuit 34. Output device 32 will typically include a monitor or printer for generating reconstituted images based upon the image enhancement processing carried out by circuit 24.

It should be noted that, while in the present discussion reference is made to discrete pixel images generated by an MRI system, the signal processing techniques described herein are not limited to any particular imaging modality. Accordingly, these techniques may also be applied to image data acquired by X-ray systems, digital radiography systems, PET systems, and computer tomography systems, among others. It should also be noted that in the embodiment described, signal processing circuit 24, memory circuit 26, and input and output interface circuits 30 and 34 are included in a programmed digital computer. However, circuitry for carrying out the techniques described herein may be configured as appropriate coding in application-specific microprocessors, analog circuitry, or a combination of digital and analog circuitry.

Figure 2:
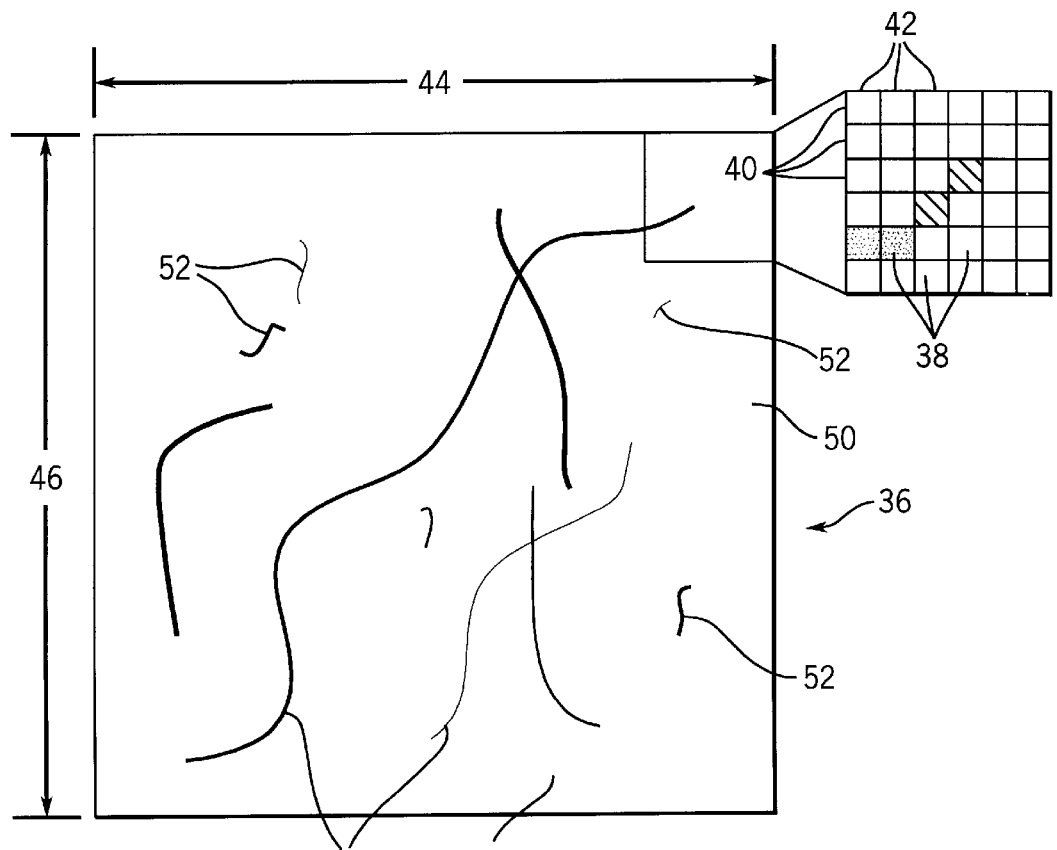
FIG. 2 illustrates a diagram of an exemplary discrete pixel image made up of a matrix of pixels having varying intensities defining structures and non-structures.

FIG. 2 illustrates a diagram of an exemplary discrete pixel image made up of a matrix of pixels having varying intensities defining structures and non-structures. FIG. 2 illustrates an exemplary discrete pixel image 36 produced via system 10. Image 36 is composed of a matrix of discrete pixels 38 disposed adjacent to one another in a series of rows 40 and columns 42. These rows and columns of pixels provide a pre-established matrix width 44 and matrix height 46. Typical matrix dimensions may include 256×256 pixels; 512×512 pixels; 1,024×1,024 pixels, and so forth. The particular image matrix size may be selected via input device 28 (FIG. 1) and may vary depending upon such factors as the subject to be imaged and the resolution desired.

As illustrated in FIG. 2, image 36 includes structural regions 48, illustrated as consisting of long, continuous lines defined by adjacent pixels. Image 36 also includes non-structural regions 50 lying outside of structural regions 48. Image 36 may also include isolated artifacts 52 of various sizes, which may be defined as structural regions, or which may be eliminated from the definition of structure in accordance with the techniques described below.

Figure 3:
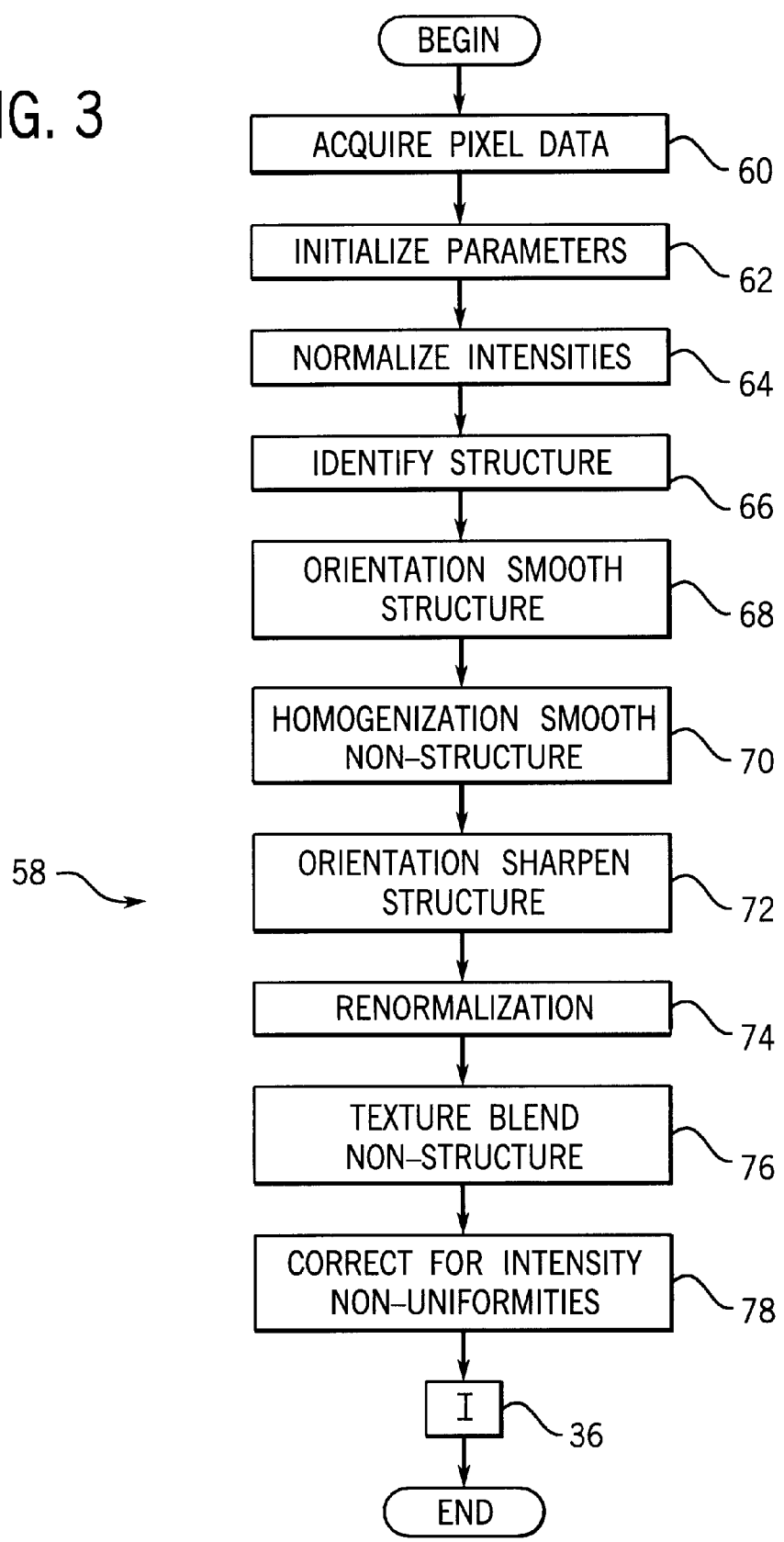
FIG. 3 illustrates a flowchart of a method for processing a discrete pixel image.

FIG. 3 illustrates a flowchart of a method for processing a discrete pixel image. In a preferred embodiment, the method of FIG. 3 is performed by signal processing circuit 24 (FIG. 1) based upon appropriate programming code stored within memory circuit 26 (FIG. 1).

The method 58 of FIG. 3 begins at step 60 when pixel data is acquired using methods generally known in the art. In step 62, parameters employed in the signal enhancement process are initialized. This initialization step includes the reading of default and operator-selected values for parameters described in the following discussion, such as the size of small regions to be eliminated from structure, a "focus parameter" and so forth. Where desired, certain of these parameters may be prompted via input device 28 (FIG. 1), requiring the operator to select between several parameter choices, such as image matrix size.

At step 64, signal processing circuit 24 collects and normalizes the raw values acquired for the pixels defining the image 36 (FIG. 2). In the illustrated embodiment, this step includes reading digital values representative of intensities at each pixel, and scaling these intensities values over a desired dynamic range. For example, the maximum and minimum intensity values in the image may be determined and used to develop a scaling factor over the full dynamic range of output device 32 (FIG. 1). Moreover, a data offset value may be added to or subtracted from each pixel value to correct for intensity shifts in the acquired data. At step 64, circuit 24 (FIG. 1) thus processes the raw image data to render a normalized image which includes pixel values filtered to span a desired portion of a dynamic range, such as 12 bits, independent of variations in the acquisition circuitry or subject.

It should be noted that while reference is made in the present discussion to intensity values within image 36 (FIG. 2), the present technique may be used to process such values or other parameters of image 36 encoded for individual pixels 38. Such parameters might include, for example, frequency or color.

At step 66, signal processing circuit 24 (FIG. 1) executes a predetermined logic routine for identifying structure 48 (FIG. 2) within image 36, as defined by data representative of the individual pixels of the image. A preferred method of identifying structure in accordance with step 66 is described in detail in conjunction with FIGS. 4–8.

Referring again to FIG. 3, the image is enhancement filtered via steps 68–76. In step 68, the structure identified during step 66 is orientation smoothed. While various techniques may be employed for this orientation smoothing, in the embodiment described, dominant orientation smoothing may be carried out, which tends to bridge gaps between spans of structure, or local orientation smoothing may be employed to avoid such bridging. Step 68 is performed on the normalized image based upon a structure mask defined during step 66. Orientation smoothing carried out in step 68 on the structural regions of the digital image, where those structural regions are identifiable based on the structure mask. Orientation smoothing thus transforms the normalized image to a filtered image which will be further refined by subsequent processing.

The filtered image is further processed as follows. At step 70, signal processing circuit 24 (FIG. 1) performs homogenization smoothing on non-structural regions of image 36 (FIG. 2). Homogenization smoothing carried out in step 70 on the non-structural regions of the digital image, where those non-structural regions are identifiable based on the structure mask. This homogenization smoothing is intended to blend features of non-structural regions into the environment surrounding the structure identified at step 66. At step 72, the structure identified at step 66 is orientation sharpened. At step 74 the filtered image is then renormalized based upon the intensity values after filtering and the original normalized intensity range. Finally, at step 76 texture present in non-structural regions of the image are blended back into the renormalized filtered image to provide background reference for the final image.

Following step 76, the filtered image is corrected for intensity non-uniformities in step 78. A preferred method of correcting for intensity non-uniformities is described in detail in conjunction with FIG. 9. The resulting pixel image values are stored in memory circuit 26 (FIG. 1) for eventual reconstruction into image 36 (FIG. 2).

The preceding flowchart illustrates, at a high level, a preferred embodiment of the method of the present invention, where steps 64–76 result in substantial noise reduction (and thus an improved SNR), and step 78 results in correction of intensity non-uniformities. Two key steps in this method, identifying structure (step 66) and correcting for intensity non-uniformities (step 78), are discussed in detail below. In particular, step 66 is described in detail in conjunction with FIGS. 4–8, and step 78 is discussed in detail in conjunction with FIG. 9.

Figure 4:
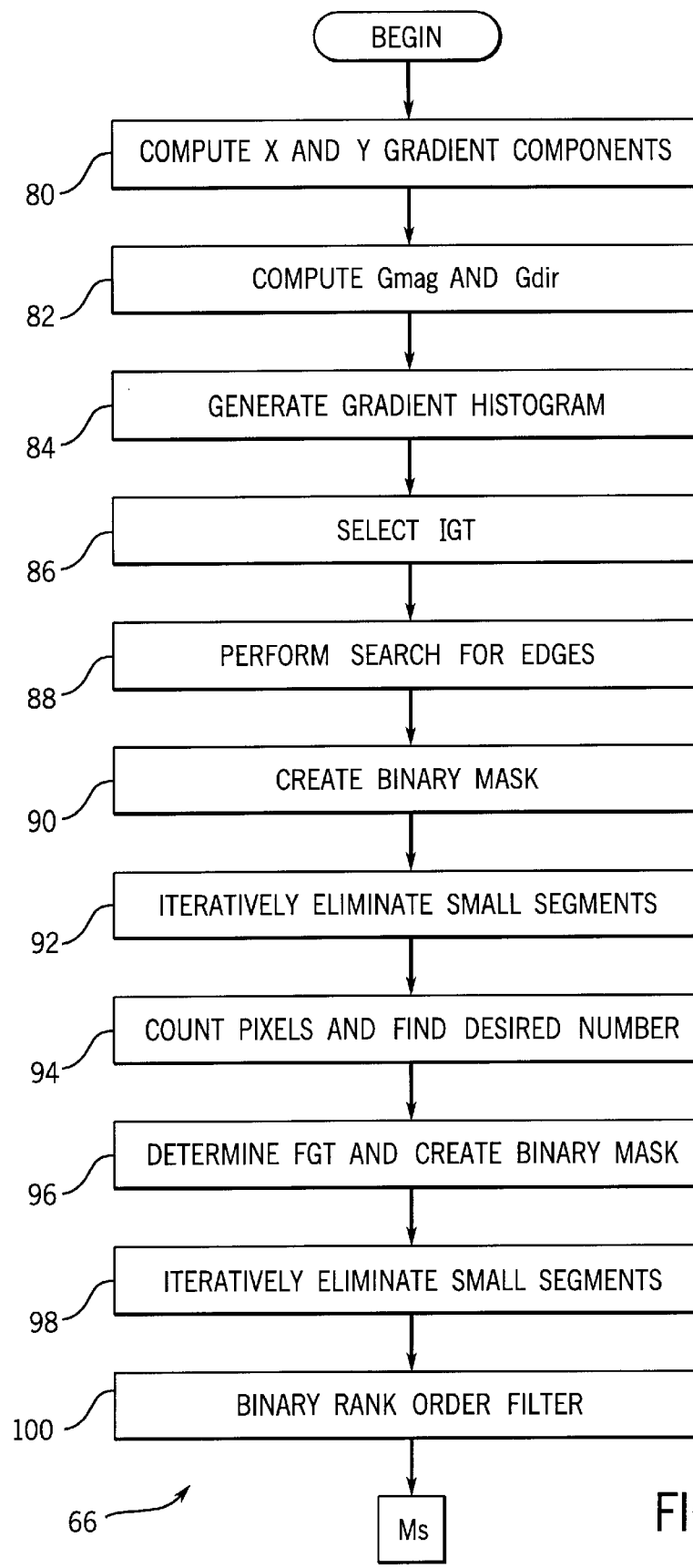
FIG. 4 illustrates a flowchart of a method for identifying structural features in a discrete pixel image.

FIG. 4 illustrates a flowchart of a method for identifying structural features (e.g., features 48, FIG. 2) in a discrete pixel image (e.g., image 36, FIG. 2). As indicated above, the logic of FIG. 4, summarized as step 66 in FIG. 3, begins with pixel data of the normalized image, In.

At step 80, X and Y gradient components for each pixel are computed. While several techniques may be employed for this purpose, in the preferred embodiment, 3×3 Sobel modules or operators 102 and 104 illustrated in FIG. 5, are employed.

Figure 5:
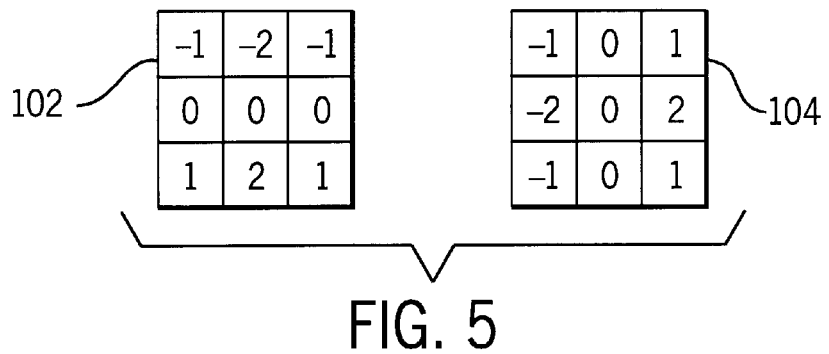
FIG. 5 illustrates a diagram of elements or modules used in the steps of FIG. 4 for generating gradient components for each discrete pixel of the image.

FIG. 5 illustrates a diagram of elements or modules used in the steps of FIG. 4 for generating gradient components for each discrete pixel of the image. As will be appreciated by those skilled in the art, module 102 is used for identifying the X gradient component, while module 104 is used for identifying the Y gradient component of each pixel. In this process, modules 102 and 104 are superimposed over the individual pixel of interest, with the pixel of interest situated at the central position of the 3×3 module. The intensity values located at the element locations within each module are multiplied by the scalar value contained in the corresponding element, and the resulting values are summed to arrive at the corresponding X and Y gradient components.

Referring back to FIG. 4, with these gradient components thus computed, at step 82 the gradient magnitude, Gmag, and gradient direction, Gdir, are computed. In the preferred embodiment, the gradient magnitude for each pixel is equal to the higher of the absolute values of the X and Y gradient components for the respective pixel. The gradient direction is determined by finding the Arctangent of the Y component divided by the X component. For pixels having an X component equal to zero, the gradient direction is assigned a value of $\pi/2$. The values of the gradient magnitudes and gradient directions for each pixel are saved in memory (e.g., memory circuit 26, FIG. 1).

It should be noted that, in alternate embodiments, different techniques may be employed for identifying the X and Y gradient components and for computing the gradient magnitudes and directions. For example, those skilled in the art will recognize that, in place of the Sobel gradient modules 102 and 104 (FIG. 5), other modules such as the Roberts or Prewitt operators may be employed. Moreover, the gradient magnitude may be assigned in other manners, such as a value equal to the sum of the absolute values of the X and Y gradient components.

Figure 6:
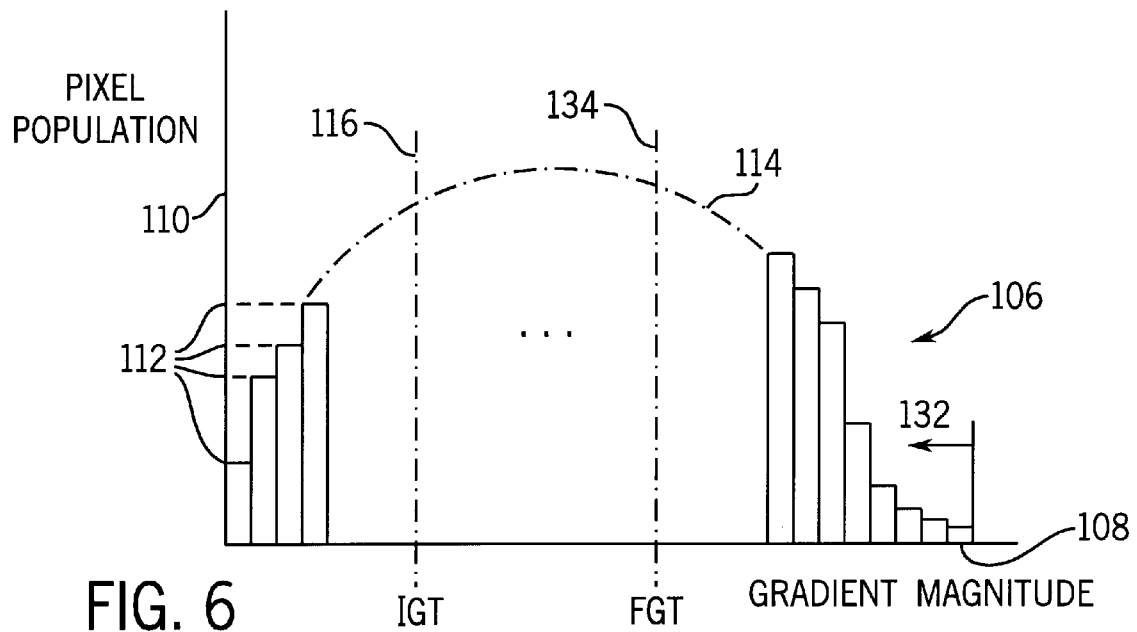
FIG. 6 illustrates a gradient histogram of an image used to identify gradient thresholds for dividing structure from non-structure in the image.

Based upon the gradient magnitude values determined at step 82, a gradient histogram is generated as indicated at step 84. FIG. 6 illustrates a gradient histogram of an image used to identify gradient thresholds for dividing structure from non-structure in the image. The histogram, designated by reference numeral 106, is a bar plot of specific populations of pixels having specific gradient values. These gradient values are indicated by positions along a horizontal axis 108, while counts of the pixel populations for each value are indicated along a vertical axis 110, with each count falling at a discrete level 112. The resulting bar graph forms a step-wise gradient distribution curve 114. Those skilled in the art will appreciate that in the actual implementation the histogram of FIG. 6 need not be represented graphically, but may be functionally determined by the signal processing circuitry operating in cooperation with values stored in memory circuitry.

Histogram 106 is used to identify a gradient threshold value for separating structural components of the image from non-structural components. The threshold value is set at a desired gradient magnitude level. Pixels having gradient magnitudes at or above the threshold value are considered to meet a first criterion for defining structure in the image, while pixels having gradient magnitudes lower than the threshold value are initially considered non-structure. The threshold value used to separate structure from non-structure is preferably set by an automatic processing or "autofocus" routine as defined below. However, it should be noted that the threshold value may also be set by operator intervention (e.g. via input device 28, FIG. 1) or the automatic value identified through the process described below may be overridden by the operator to provide specific information in the resulting image.

Referring again to FIG. 4, the process for identifying the threshold value begins at step 86 by selecting an initial gradient threshold ("IGT"). This initial gradient threshold, designated 116 in FIG. 6, is conveniently set to a value corresponding to a percentile of the global pixel population, such as 30 percent, for example. The location along axis 108 of the IGT value 116 is thus determined by adding pixel population counts from the left-hand edge of histogram 106 of FIG. 6, adjacent to axis 110 and moving toward the right (i.e., ascending in gradient values). Once the desired percentile value is reached, the corresponding gradient magnitude is the value assigned to the IGT.

Referring back to FIG. 4, at step 88, a search is performed for edges of the desired structure. The edge search proceeds, in a preferred embodiment, by locating the pixels having gradient magnitudes greater than the IGT value selected in step 86, and considering a 5×5 pixel neighborhood surrounding the relevant pixels of interest. Within the 5×5 pixel neighborhood of each pixel of interest, pixels having gradient magnitudes above the IGT and having directions which do not differ from the direction of the pixel of interest by more than a predetermined angle are counted. In the preferred embodiment, an angle of 0.35 radians is used in this comparison step. If the 5×5 neighborhood count is greater than a preset number (3 in the present embodiment), the pixel of interest is identified as a relevant edge pixel. At step 90, a binary mask image is created, wherein pixels identified as relevant edge pixels in step 88 are assigned a value of 1, while all other pixels are assigned a value equal to zero.

Figure 7:
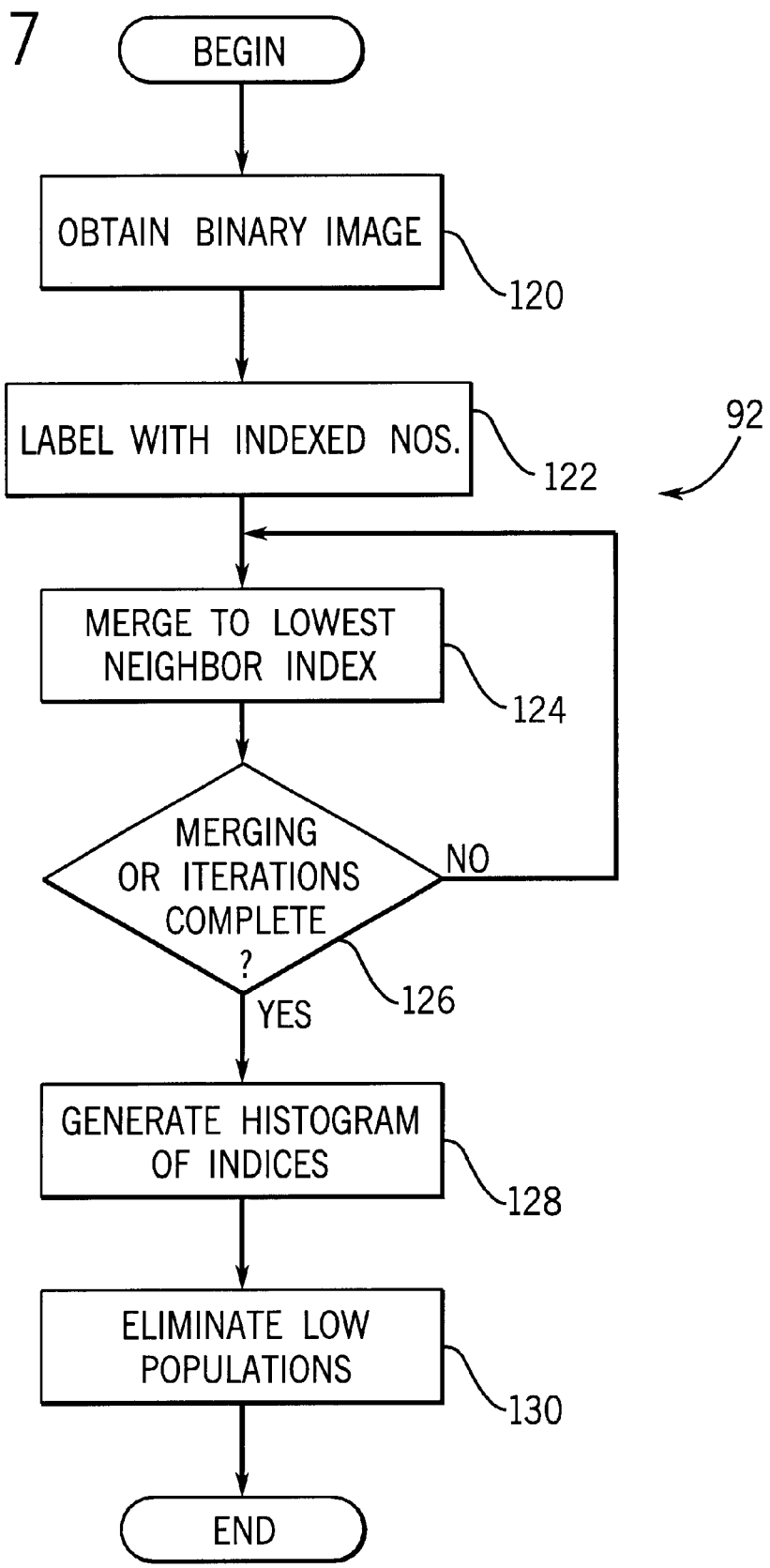
FIG. 7 illustrates a flowchart of a method for selectively eliminating small or noisy regions from the structure definition.

At step 92 small or noisy segments identified as potential candidates for structure are iteratively eliminated. FIG. 7 illustrates a flowchart of a method for selectively eliminating small or noisy regions from the structure definition. The process begins at step 120 where a binary image is obtained by assigning a value of 1 to pixels having a gradient magnitude value equal to or greater than a desired value, and a value of zero to all other pixels. This binary image or mask is substantially identical to that produced at step 90 (FIG. 4).

At step 122, each pixel having a value of 1 in the binary mask is assigned an index number beginning with the upper-left hand corner of the image and proceeding to the lower right. The index numbers are incremented for each pixel having a value of 1 in the mask. At step 124, the mask is analyzed row-by-row beginning in the upper left by comparing the index values of pixels within small neighborhoods. For example, when a pixel is identified having an index number, a four-connected comparison is carried out, wherein the index number of the pixel of interest is compared to index numbers, if any, for pixels immediately above, below, to the left, and to the right of the pixel of interest. The index numbers for each of the connected pixels are then changed to the lowest index number in the connected neighborhood. The search, comparison, and reassignment then continues through the entire pixel matrix, resulting in regions of neighboring pixels being assigned common index numbers. In the preferred embodiment, the index number merging step of 124 may be executed several times, as indicated by step 126 in FIG. 7. Each subsequent iteration is preferably performed in an opposite direction (i.e., from top-to-bottom, and from bottom-to-top).

Following the iterations accomplished through subsequent search and merger of index numbers, the index number pixel matrix will contain contiguous regions of pixels having common index numbers. As indicated at step 128 in FIG. 7, a histogram is then generated from this index matrix by counting the number of pixels having each index number appearing in the index matrix. As will be apparent to those skilled in the art, each separate contiguous region of pixels having index numbers will have a unique index number. At step 130, regions represented by index numbers having populations lower than a desired threshold are eliminated from the definition of structure as determined at step 90 of FIG. 4. In a presently preferred embodiment, regions having a pixel count lower than 50 pixels are eliminated in step 130. The number of pixels to be eliminated in this step, however, may be selected as a function of the matrix size and the amount and size of isolated artifacts to be permitted in the definition of structure in the final image.

Referring back to FIG. 4, with pixels for small segments eliminated from the binary mask created at step 90, the number of pixels remaining in the binary mask are counted as indicated at step 94. While the resulting number may be used to determine a final gradient threshold, it has been found that a convenient method for determining a final gradient threshold for the definition of structure includes the addition of a desired number of pixels to the resulting pixel count. For example, in a preferred embodiment, a value of 4,000 is added to the binary mask count resulting from step 92 to arrive at a desired number of pixels in the image structure definition. This parameter may be set as a default value, or may be modified by an operator. In general, a higher additive value produces a sharper image, while a lower additive value produces a smoother image. This parameter, referred to in the present embodiment as the "focus parameter," may thus be varied to redefine the classification of pixels into structures and non-structures.

With the desired number of structure pixels thus identified, a final-gradient threshold ("FGT") is determined as illustrated at step 96 in FIG. 4, based upon the histogram 106 (FIG. 6). In particular, the population counts for each gradient magnitude value beginning from the right-hand edge of histogram 106 are summed moving to the left as indicated by reference number 132 (FIG. 6). Once the desired number of structural pixels is reached (i.e., the number of pixels counted at step 94 plus the focus parameter), the corresponding gradient magnitude value is identified as the final gradient threshold 134. Based upon this final gradient threshold, a new binary mask is defined by assigning pixels having values equal to or greater than the FGT a value of 1, and all other pixels a value of zero. At step 98, the resulting binary mask is filtered to eliminate small, isolated segments in a process identical to that described above with respect to step 92 and FIG. 7. However, at step 98, rather than a four-connected neighborhood, a eight-connected neighborhood (i.e., including pixels having shared edges and corners bounding the pixel of interest) is considered in the index number merger steps.

At step 100 in FIG. 4, the feature edges identified through the previous steps, representative of candidate structures in the image, are binary rank order filtered. While various techniques may be employed for this enhancing identified candidate structures, it has been found that the binary rank order filtering provides satisfactory results in expanding and defining the appropriate width of contiguous features used to define structural elements.

Figure 8:
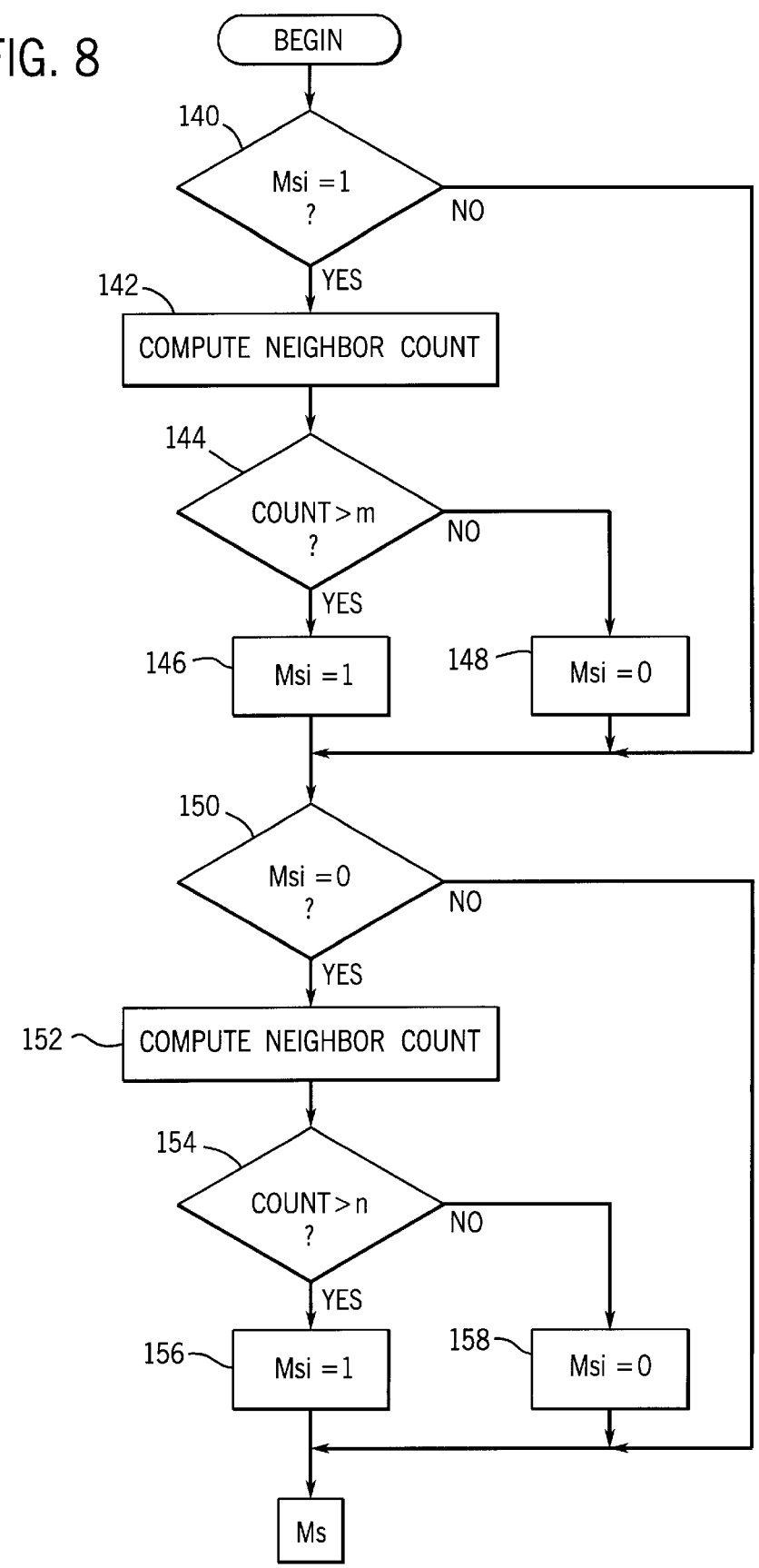
FIG. 8 illustrates a flowchart of a method for processing structural features identified in the image by binary rank order filtering.

FIG. 8 illustrates a flowchart of a method for processing structural features identified in the image by binary rank order filtering. The binary rank order filtering process begins at step 140 with the binary mask generated and refined in the foregoing steps. At step 140, circuit 24 determines whether each pixel in the binary mask has a value of 1. If the pixel found to have a value of 1 in the mask, a neighborhood count is performed at step 142. In this neighborhood count, pixels in the binary mask having values of 1 are counted within a 3×3 neighborhood surrounding the structural pixel of interest. This count includes the pixel of interest. At step 144, circuit 24 determines whether the count from step 142 exceeds a desired count, m. In the preferred embodiment, the value of m used at step 144 is 2. If the count is found to exceed the value m, the value of 1 is reassigned to the pixel of interest, as indicated at step 146. If, however, the count is found not to exceed the value of m, the pixel of interest is assigned the value of 0 in the mask as indicated at step 148. Following steps 146 and 148, or if the pixel is found not to have an original value of 1 in the mask at step 140, the method proceeds to step 150.

At step 150, circuit 24 reviews the structure mask to determine whether each pixel of interest has a value of 0. If a pixel is located having a value of 0, circuit 24 advances to step 152 to compute a neighborhood count similar to that described above with respect to step 142. In particular, a 3×3 neighborhood around the non-structure pixel of interest is examined and a count is determined of pixels in that neighborhood having a mask value of 1. At step 154, this neighborhood count is compared to a parameter, n. If the count is found to exceed the parameter n, the mask value for the pixel is changed to 1 at step 156. If the value is found not to exceed n, the mask pixel retains its 0 value as indicated at step 158. In the preferred embodiment, the value of n used in step 154 is 2.

Following step 156 or step 158, the resulting mask, Ms, contains information identifying structural features of interest and non-structural regions. Specifically, pixels in the mask having a value of 1 are considered to identify structure, while pixels having a value of 0 are considered to indicate non-structure.

FIGS. 4–8 illustrated a preferred method for identifying structure, where the structure information can then be used to enhancement filter the image in accordance with steps 68–76 of FIG. 3. Another key step to the method of FIG. 3 is the step of correcting for non-uniformities (step 78) in the enhanced image.

Figure 9:
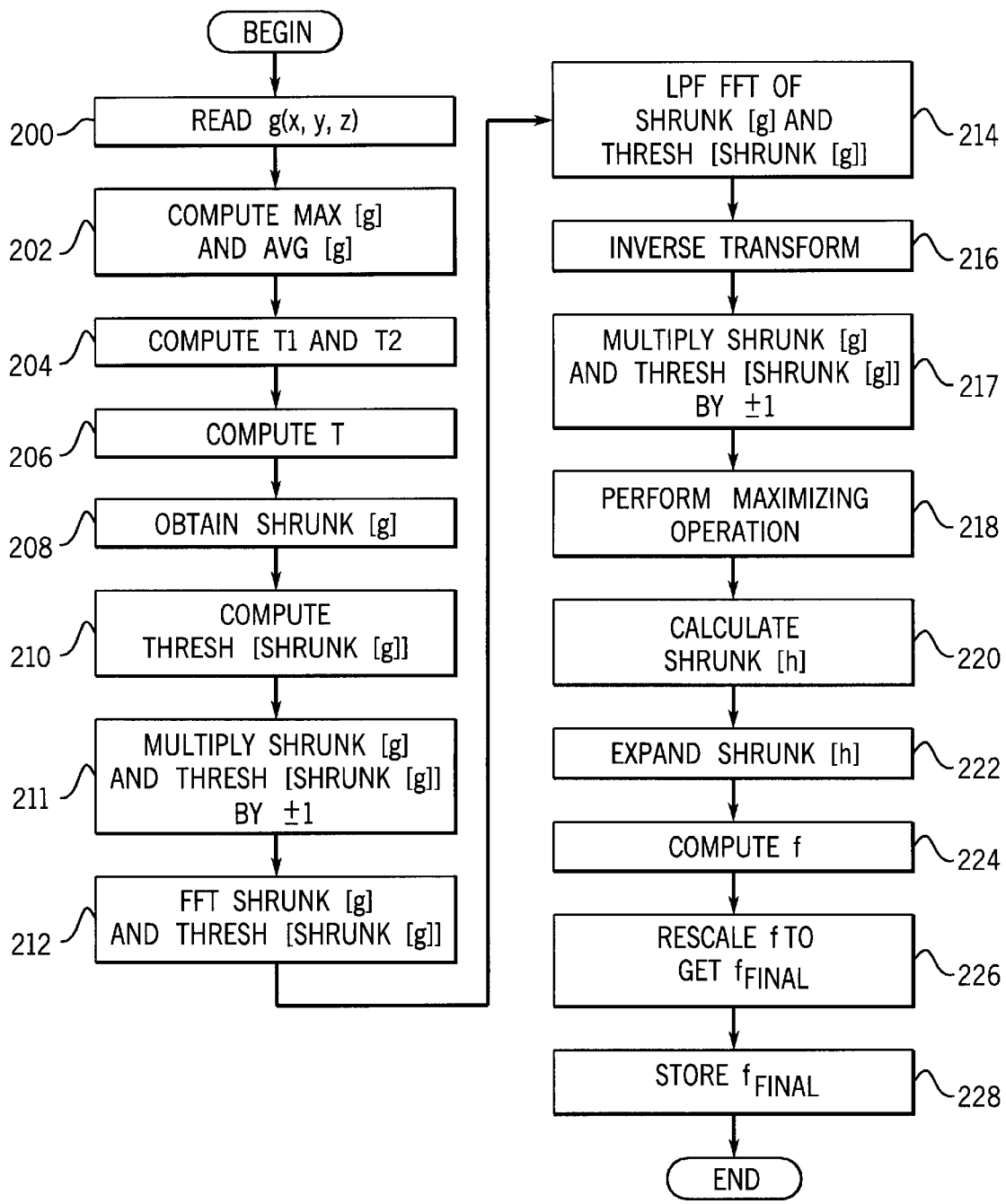
FIG. 9 illustrates a flowchart of a method for correcting for non-uniformities in an image.

FIG. 9 illustrates a flowchart of a method for correcting for non-uniformities in an image. The standard equation describing the constitution of image data is:

$$g = h*f + n,$$

where g is the image data, h is the non-uniformity function, f is the shading corrected image, and n is the imaging noise. Essentially, when given g, the method of the preferred embodiment determines h and n.

The method begins, in step 200, by reading in image data, g(x,y,z). In a preferred embodiment, the image data has been pre-processed through steps 64–76 of FIG. 3. In alternate embodiments, only some of steps 64–76 may have been carried out on the image data before step 200.

In step 202, the maximum intensity value, Max[g], and the average intensity value, Avg[g], are computed. These values are used in later steps of the method.

Next, step 204 computes two threshold values which will be used to determine a final threshold parameter. The first threshold value, T1=a*Avg[g], where a is some fractional value. For example, in one embodiment, a=0.4, although other values could also be used. The second threshold value, T2=b*Max[g], where b also is some fractional value. In one embodiment, b=0.025, although b could be set higher for noisier images, and lower for less noisy images.

A final threshold parameter, T, is then computed in step 206. In a preferred embodiment, T=Max[T1,T2]. Thus, T is the maximum of a threshold value which is based on Avg[g] or a threshold value which is based on Max[g]. Determination of T in this manner results in a more robust average intensity because it does not necessarily make the final threshold parameter dependent on the maximum intensity pixel.

After T is determined, SHRUNK[g] is obtained, in step 208. In accordance with this operation, the pixel array of g is reduced along each edge by a shrink parameter. For a three-dimensional array, the pixel array would be reduced by shrink parameters S1, S2, and S3 along edges respectively parallel to the x, y, and z axes. For a two-dimensional array in the x-y plane, S1 and S2 may equal a common shrink parameter, S. For example, if g represents a 256×256 array, and SHRUNK[g] represents a 32×32 pixel array, then S=256/32 =8.

If an imaging slice is taken along the z-direction, shrink parameter S3 is desirably selected so that the pixel dimension of SHRUNK[g] along the z-direction will be somewhat less than the pixel dimensions for the x or y directions. In a preferred embodiment, each pixel of SHRUNK[g] has an intensity equal to the average intensity of a corresponding S1*S2*S3 submatrix of pixels of the g function array.

In step 210, THRESH[SHRUNK[g]] is computed. Essentially, the intensity of respective pixels of SHRUNK [g] are compared with the threshold, T. If the intensity of a particular pixel is less than or equal to T, the pixel is assigned the value of zero. Otherwise, it is assigned a value of A*Avg[g], where A is usefully selected to be 0.01. In other embodiments, other values of A could be used.

In step 211, SHRUNK[g] and THRESH[SHRUNK[g]] are multiplied by ±1, depending on whether the sum of the pixel index is even or odd. The purpose of this multiplication step is so that radial symmetry can be used in the frequency domain.

In step 212, transforms of SHRUNK[g] and THRESH [SHRUNK[g]] are performed. In a preferred embodiment, a Fast Fourier Transform (FFT) is used, although other transforms, which will readily occur to those of skill in the art, may be employed. For example, a Discrete Cosine Transform could be used.

Next, a low pass filtering (LPF) process is performed in step 214. In a preferred embodiment, respective transform components are multiplied by coefficients predetermined in accordance with a Gaussian filter operation. Such filter operation, which provides a pass band having the shape of a Gausian curve of selected variance, is considered to be well-known in the art. In alternate embodiments, other techniques, which will readily occur to those of skill in the art, may be employed.

The inverse transform is then computed in step 216, resulting in LPF[SHRUNK[g]] and LPF[THRESH [SHRUNK[g]]]. Then, in step 217, LPF[SHRUNK[g]] and LPF[THRESH[SHRUNK[g]]] are multiplied by ±1, again depending on whether the sum of the index is even or odd. This multiplication step reverses the effects of step 211.

Next, a maximizing operation is performed in step 218, wherein respective pixel intensities of the two filtered functions are compared with a small regularization parameter, $\Psi_2$ using the equations: max(LPF[SHRUNK[g]], $\Psi_2$) and max(LPF[THRESH[SHRUNK[g]]], $\Psi_2$). Usefully, $\Psi_2$=0.0001, although different values could be used.

Essentially, the computed pixel intensity is either kept, if it is greater than $\Psi_2$, or else replaced with the value of $\Psi_2$, if $\Psi_2$ is greater. This maximizing operation improves numerical stability in subsequent operations by eliminating division by very small or near-zero numbers. This, in turn, reduces noise amplification.

A shrunken form of the distortion function, h, can then be determined, in step 220, from the maximizing operation as follows:

$$SHRUNK[h] = \max(LPF[SHRUNK[g]], \Psi_2)/\max(LPF[THRESH[SHRUNK[g]]], \Psi_2).$$

SHRUNK[h] is then expanded, in step 222, to provide a distortion function, h, comprising the original array. SHRUNK[h] can be expended, for example, using linear or other interpolation methods. In the case of a three-dimensional array, trilinear interpolation could be used, for example. In the case of a two-dimensional array, bilinear interpolation could be used.

Given the distortion function, h, the corrected function, f, can be readily computed in step 224 from the following relationship, accounting for noise:

$$f=g*h/(h*h+\Psi_1),$$

where $\Psi_1$ is a regularization parameter derived from the reciprocal of the SNR.

It will be seen that the intensity range of f is reduced from the original intensity range of g as a result of the division shown in the above equation. Accordingly, it is necessary to rescale the function f back to the original intensity range, as illustrated by step 226. In a preferred embodiment, this is achieved by applying the following relations:

i)

$$f_{uniform}(x,y)=f(x,y)*Avg(g)/Avg(f), \text{ for all } (x,y),$$

where $f_{uniform}$ is the initial non-uniformity corrected image;

ii) Construct a binary mask image mask(x,y) such that
if $f_{uniform}(x,y)<g(x,y)<T$, mask(x,y)=1
else if $f_{uniform}(x,y)/20>g(x,y)<T$, mask(x,y)=1;
else if g(x,y)<Max[g]/100, mask(x,y)=1
else mask(x,y)=0
(Note that pixels with value 1 are foreground pixels and value 0 are background pixels);

iii) Set mask image pixels which are 1 to 0 if they are connected with other 1's to make the connectivity count under a pre-specified number (e.g, 1500);

iv) Set mask image pixels which are 0 to 1 if they are connected with other 0's to make the connectivity count under a pre-specified number (e.g, 1500);

v) Perform a binary dilation operation followed by a binary erosion operation to pen any bridges thinner than the chosen structuring element;

vi) Set mask image pixels which are 0 to 1 if they are connected with other 0's to make the connectivity count under a pre-specified number (e.g, 1500);

vii) Merge the corrected and uncorrected data using the following steps:

$$f_{final}(x,y)=g(x,y), \text{ if } mask(x,y)=1 \text{ or } f_{uniform}(x,y)<1,$$

or $$f_{final}(x,y)=f_{uniform}(x,y) \text{ otherwise}.$$

In this step, the final non-uniformity corrected image, $f_{final}$, is reconstructed from initial non-uniformity corrected image, $f_{uniform}$, and the input image to the non-uniformity correction process.

In an alternate embodiment, the following relations could be used. However, the preferred embodiment reduces some objectionable artifacts which may be present with the following relations, where these artifacts may cause intensity mismatches in dark areas. The alternate embodiment relations are:

$$f_{uniform}(x, y) = f(x, y) * Avg(g)/Avg(f), \text{ for all } (x, y).$$

$$f_{final}(x, y) = g(x, y) \text{ if } f_{uniform}(x, y) < g(x, y) < T;$$
$$= g(x, y) \text{ if } 0 <= f_{uniform}(x, y) < \text{epsilon} < 10;$$
$$= f_{uniform}(x, y) \text{ otherwise.}$$

In still another alternate embodiment, the following relations could alternatively be used. However, the following relations may yield unnatural drop-off or low intensity pixels in the corrected image which could be avoided by using one of the previous embodiments. The alternate embodiment relations are:

$$f_{final} = (f - \text{Min}[f]) * \text{Max}[g]/(\text{Max}[f] - \text{Min}[f]), \text{ inside a prespecified region of interest,}$$

or $$f_{final} = 0, \text{ outside the prespecified region of interest,}$$

where Min[.] and Max[.] are the minimum and maximum intensity values, respectively, in the prespecified part of the image.

After step 226, $f_{final}$ can then be stored to memory circuit 26 (FIG. 1) for later use.

The method represents a robust algorithm for several reasons. First, in determining the threshold, T, average pixel intensity is used, rather than depending on the maximum intensity pixel, as has been done in previous methods. Second, a final non-uniformity corrected image is reconstructed from an initial non-uniformity corrected image and the input to the non-uniformity correction process.

The method and apparatus of the present invention provide the ability to produce higher-quality digital images in which noise has been reduced and non-uniformities have been corrected. The method and apparatus of the present invention overcome limitations of the prior art by using a robust scheme which does not remove noise, but rather treats that noise as textural information. In addition, the method and apparatus of the present invention substantially reduce unnatural noise amplification by mitigating noise before it is amplified. This provides an improvement over prior art techniques in which noise is multiplied and later post-filtered.

The method and apparatus of the present invention depart from the prior art methods described by Gerig, Guillemaud and Brady, while simultaneously achieving SNR improvements and shading correction. This is accomplished by segmenting the image before performing appropriate actions. Unlike the method of Gerig, the filter used for the current invention does not attempt to remove noise/weak structures but just mitigates their contribution. Smoothing is done only along the structures while sharpening is done across them. In the non-structure regions containing weak structures and noise, a homogenizing smoothing is done and a part of the texture is added back to retain the original spatial characteristics in a mitigated form. In any case, details are not lost in the current SNR improvement scheme as they are in prior-art methods.

Essentially, the method and apparatus of the present invention both enhance features and correct for non-uniformities in a digital image. In accordance with a preferred embodiment, the digital image is enhancement pre-filtered, using preferred parameters, in order to prevent blurring of salient features. Next, intensity non-uniformities in the image are corrected using a preferred technique. The result of the pre-filtering and correction method is a visually pleasing uniform image which is easier to visualize and film than images produced by prior art techniques. Thus, the method and apparatus of the present invention exploit better filter characteristics and robust non-uniformity correction to achieve higher image quality than previously possible.

Thus, a method and apparatus for enhancing and correcting digital images has been described which overcomes specific problems, and accomplishes certain advantages relative to prior art methods and mechanisms. Specifically, the method and apparatus of the present invention provide the ability to produce higher-quality digital images in which noise has been reduced and non-uniformities have been corrected.

The foregoing descriptions of the specific embodiments will so fully reveal the general nature of the invention that others can, by applying current knowledge, readily modify and/or adapt the embodiments for various applications without departing from the generic concept. Therefore, such adaptations and modifications should, and are intended to be comprehended within the meaning and range of equivalents of the disclosed embodiments. In particular, while a preferred embodiment has been described in terms of applying the method and apparatus of the present invention to MRI, those of skill in the art will understand, based on the description herein, that the method and apparatus of the present invention also could be applied to other digital imaging modalities. Moreover, those skilled in the art will appreciate that the flowcharts presented herein are intended to teach the present invention and that different techniques for implementing program flow that do not necessarily lend themselves to flowcharting may be devised. For example, each task discussed herein may be interrupted to permit program flow to perform background or other tasks. In addition, the specific order of tasks may be changed, and the specific techniques used to implement the tasks may differ from system to system.

It is to be understood that the phraseology or terminology employed herein is for the purpose of description, and not of limitation. Accordingly, the invention is intended to embrace all such alternatives, modifications, equivalents, and variations as fall within the spirit and broad scope of the appended claims.

What is claimed is:

1. A method for enhancing and correcting a digital image made up of a pixel array, the method comprising the steps of:
   a) acquiring pixel data which defines a digital image of internal features of a physical subject;
   b) identifying structural regions within the digital image defined by the pixel data, resulting in a structure mask showing the structural regions and non-structural regions;
   c) enhancement filtering the digital image using the structure mask, resulting in a first filtered image; and
   d) correcting for intensity non-uniformities in the first filtered image, resulting in an enhanced, corrected digital image, the correcting step including
      d1) reading in image data representing the first filtered image;
      d2) determining a first threshold value, T;
      d3) reducing the pixel array using a shrink parameter, S, resulting in a second array;
      d4) changing values of pixels of the second array based on comparison of the values with the first threshold value, resulting in a third array;
      d5) transforming and filtering the second array and the third array, resulting in a fourth array and a fifth array;

d6) maximizing the fourth array and the fifth array by changing values of pixels of the fourth array and the fifth array, resulting in a sixth array and a seventh array;

d7) determining a distortion function based on the sixth array and the seventh array;

d8) computing a corrected function from the distortion function and the image data; and d9) rescaling the corrected function back to an original intensity range.

2. The method as claimed in claim 1, wherein the step of enhancement filtering comprises the steps of:

c1) orientation smoothing the structural regions of the digital image based on the structure mask, resulting in a second filtered image;

c2) homogenization smoothing the non-structural regions of the second filtered image in order to blend features of the non-structural regions into an environment surrounding the structural regions, resulting in a third filtered image;

c3) orientation sharpening the structural regions of the third filtered image, resulting in a fourth filtered image;

c4) renormalizing the fourth filtered image, resulting in a fifth filtered image; and c5) texture blending the non-structural regions of the fifth filtered image, resulting in the first filtered image.

3. The method as claimed in claim 1, wherein the step of determining the first threshold value comprises the steps of:

d2a) determining a second threshold value as $T1=a*Avg[g]$, where g represents the image data and a is a first fractional value;

d2b) determining a third threshold value as $T2=b*Max[g]$, where b is a second fractional value; and d2c) determining the first threshold value as $T=Max[T1, T2]$.

4. The method as claimed in claim 1, wherein the step of determining a distortion function comprises the steps of:

d7a) determining a shrunken form, SHRUNK, of the distortion function, h, using the equation $SHRUNK[h]=\max(LPF[SHRUNK[g]], \Psi_2)/\max(LPF[THRESH[SHRUNK[g]]], \Psi_2)$, where g is image data, $\Psi_2$ is a regularization parameter, LPF[SHRUNK[g]] is a low pass filtered form of a shrunken form of the image data, LPF[THRESH[SHRUNK[g]]] is a low pass filtered form of the shrunken form of the image data after a threshold operation has been applied, and max( ) is a maximizing function; and d7b) expanding SHRUNK[h] to the distortion function using bilinear interpolation for a two-dimensional array or trilinear interpolation for a three-dimensional array.

5. The method as claimed in claim 1, wherein the step of rescaling the corrected function comprises the steps of:

d9a) calculating an initial non-uniformity corrected image using the equation $f_{uniform}(x,y)=f(x,y)*Avg(g)/Avg(f)$, for all $(x,y)$, d9b) constructing a binary mask image mask(x,y) such that if $f_{uniform}(x,y)<g(x,y)<T$, mask(x,y)=1
else if $f_{uniform}(x,y)/20>g(x,y)<T$, mask(x,y)=1,
else if $g(x,y)<Max[g]/100$, mask(x,y)=1,
else mask(x,y)=0 d9c) setting mask image pixels which are 1 to 0 if they are connected with other 1's to make a connectivity count under a first pre-specified number;

d9d) setting the mask image pixels which are 0 to 1 if they are connected with other 0's to make the connectivity count under a second pre-specified number;

d9e) performing a binary dilation operation followed by a binary erosion operation to pen any bridges thinner than a chosen structuring element;

d9f) setting the mask image pixels which are 0 to 1 if they are connected with other 0's to make the connectivity count under a third pre-specified number; and d9g) merging corrected and uncorrected data using the following equations $f_{final}(x,y)=g(x,y)$, if mask(x,y)=1 or $f_{uniform}(x,y)<1$, or $f_{final}(x,y)=f_{uniform}(x,y)$ otherwise.

6. The method as claimed in claim 1, wherein the step of rescaling the corrected function comprises the steps of:

d9a) calculating an initial non-uniformity corrected image using the equation $f_{uniform}(x,y)=f(x,y)*Avg(g)/Avg(f)$, for all $(x,y)$;

and d9b) merging corrected and uncorrected data using the following equations $f_{final}(x,y)=g(x,y)$ if $f_{uniform}(x,y)<g(x,y)<T$;

$=g(x,y)$ if $0<=f_{uniform}(x,y)<epsilon<10$;

$=f_{uniform}(x,y)$ otherwise.

7. The method as claimed in claim 1, wherein the step of rescaling the corrected function comprises the step of merging corrected and uncorrected data using the following equations:

$f_{final}=(f-Min[f])*Max[g]/(Max[f]-Min[f])$, inside a prespecified region of interest, or $f_{final}=0$, outside the prespecified region of interest, where Min[f] and Max[g] are minimum and maximum intensity values, respectively, in the prespecified region of interest.

8. An apparatus for enhancing and correcting a digital image made up of a pixel array, wherein the digital image represents an image of internal features of a physical subject, the apparatus comprising:

a signal acquisition circuit configured to receive and transmit signals representing the internal features; and a signal processing circuit configured to receive the signals, acquire pixel data by digitizing the signals, and to enhance and correct the digital image by identifying structural regions within the digital image defined by the pixel data, resulting in a structure mask showing the structural regions and non-structural regions, enhancement filtering the digital image using the structure mask, resulting in a first filtered image, the enhancement filtering including the steps of a) orientation smoothing the structural regions of the digital image based on the structure mask, resulting in a second filtered image;

b) homogenization smoothing the non-structural regions of the second filtered image in order to blend features of the non-structural regions into an environment surrounding the structural regions, resulting in a third filtered image;

c) orientation sharpening the structural regions of the third filtered image, resulting in a fourth filtered image;

d) renormalizing the fourth filtered image, resulting in a fifth filtered image; and e) texture blending the non-structural regions of the fifth filtered image, and correcting for intensity non-uniformities in the first filtered image, resulting in an enhanced, corrected digital image.

9. A method for enhancing and correcting a digital image made up of a pixel array, the method comprising the steps of:

a) acquiring pixel data which defines a digital image of internal features of a physical subject;

b) identifying structural regions within the digital image defined by the pixel data, resulting in a structure mask showing the structural regions and non-structural regions;

c) enhancement filtering the digital image using the structure mask, resulting in a first filtered image, the enhancement filtering including the steps of c1) orientation smoothing the structural regions of the digital image based on the structure mask, resulting in a second filtered image;

c2) homogenization smoothing the non-structural regions of the second filtered image in order to blend features of the non-structural regions into an environment surrounding the structural regions, resulting in a third filtered image;

c3) orientation sharpening the structural regions of the third filtered image, resulting in a fourth filtered image;

c4) renormalizing the fourth filtered image, resulting in a fifth filtered image; and c5) texture blending the non-structural regions of the fifth filtered image, resulting in the first filtered image; and d) correcting for intensity non-uniformities in the first filtered image, resulting in an enhanced, corrected digital image.

* * * * *